(12) United States Patent (10) Patent No.: US 9,171,700 B2
Gilmore (45) Date of Patent: Oct. 27, 2015

(54) PLASMA PULSE TRACKING SYSTEM AND METHOD

(71) Applicant: COMET Technologies USA, Inc., San Jose, CA (US)

(72) Inventor: Jack Gilmore, Fort Collins, CO (US)

(73) Assignee: COMET Technologies USA, Inc., San Jose, CA (US)

( * ) Notice: Subject to any disclaimer, the term of this patent is extended or adjusted under 35 U.S.C. 154(b) by 179 days.

(21) Appl. No.: 13/913,700

(22) Filed: Jun. 10, 2013

(65) Prior Publication Data

US 2014/0152189 A1 Jun. 5, 2014

Related U.S. Application Data

(60) Provisional application No. 61/660,236, filed on Jun. 15, 2012, provisional application No. 61/781,226, filed on Mar. 14, 2013.

(51) Int. Cl.
*H05B 37/02* (2006.01)
*H01J 37/32* (2006.01)

(52) U.S. Cl.
CPC .............................. *H01J 37/32183* (2013.01)

(58) Field of Classification Search
None
See application file for complete search history.

(56) References Cited

U.S. PATENT DOCUMENTS

| | | | | |
|---|---|---|---|---|
| 4,679,007 A * | 7/1987 | Reese et al. | .................. | 333/17.3 |
| 5,195,045 A * | 3/1993 | Keane et al. | .................. | 702/107 |
| 5,394,061 A * | 2/1995 | Fujii | ........................ | 315/111.21 |
| 5,576,629 A * | 11/1996 | Turner et al. | .................. | 324/709 |
| 5,629,653 A * | 5/1997 | Stimson | ....................... | 333/17.3 |
| 5,849,136 A * | 12/1998 | Mintz et al. | .............. | 156/345.44 |
| 5,889,252 A * | 3/1999 | Williams et al. | ......... | 219/121.54 |
| 6,313,584 B1 * | 11/2001 | Johnson et al. | .......... | 315/111.21 |
| 6,313,587 B1 * | 11/2001 | MacLennan et al. | ......... | 315/248 |
| 6,677,828 B1 * | 1/2004 | Harnett et al. | ............... | 333/17.3 |
| 6,949,887 B2 * | 9/2005 | Kirkpatrick et al. | .......... | 315/248 |
| 8,779,662 B2 * | 7/2014 | Boston | ..................... | 315/111.21 |
| 8,928,229 B2 * | 1/2015 | Boston | ..................... | 315/111.21 |
| 2003/0230984 A1 * | 12/2003 | Kitamura et al. | ........ | 315/111.41 |
| 2005/0001555 A1 * | 1/2005 | Parsons et al. | ........... | 315/111.21 |
| 2008/0061901 A1 * | 3/2008 | Gilmore | ...................... | 333/17.3 |
| 2010/0098882 A1 * | 4/2010 | Lubomirsky et al. | ......... | 427/569 |
| 2012/0097524 A1 * | 4/2012 | Pipitone et al. | ............ | 204/192.1 |
| 2012/0098575 A1 * | 4/2012 | Boston | ........................... | 327/104 |
| 2012/0145322 A1 * | 6/2012 | Gushiken et al. | ........ | 156/345.28 |
| 2013/0214683 A1 * | 8/2013 | Valcore et al. | ........... | 315/111.21 |

* cited by examiner

*Primary Examiner* — Douglas W Owens
*Assistant Examiner* — Srinivas Sathiraju
(74) *Attorney, Agent, or Firm* — Edmonds & Nolte, PC

(57) ABSTRACT

A plasma processing system may include a radio frequency (RF) generator configured to supply a pulsing process signal to a target in a plasma processing chamber via a RF matching network. A phase and magnitude detector circuit is coupled to the RF generator and configured to sense the pulsing process signal and output a magnitude error signal and a phase error signal. A pulse tracking circuit is electrically coupled to the phase and magnitude detector circuit and configured to receive the magnitude error signal and the phase error signal and output a tracked magnitude signal and a tracked phase signal. A match controller is electrically coupled to the pulse tracking circuit and the RF matching network and configured to receive the tracked magnitude signal and the tracked phase signal and vary an impedance of the RF matching network in response to the tracked magnitude and phase signals.

25 Claims, 11 Drawing Sheets

PLASMA PULSE TRACKING SYSTEM AND METHOD

CROSS-REFERENCE TO RELATED APPLICATIONS

This non-provisional application claims priority to U.S. Provisional Patent Application No. 61/660,236, filed Jun. 15, 2012, and U.S. Provisional Patent Application No. 61/781,226, filed Mar. 14, 2013, both entitled "Plasma Pulse Tracking System and Method." The contents of both of these priority applications are hereby incorporated by reference in their entirety to the extent consistent with the present disclosure.

BACKGROUND

Plasma processing systems (for example, physical vapor deposition ("PVD") systems) are used to deposit thin layers of a target material onto a substrate or etch patterns into a target. Plasma processing systems generally include a radio frequency ("RF") generator that transmits a continuous and/or pulsing signal to a plasma chamber. An RF match having a variable impedance is generally located between the RF generator and the plasma chamber. The RF match may be tuned, i.e., the impedance may be varied, to make the output impedance of the RF match be the complex conjugate of the plasma chamber's impedance. Tuning the RF match reduces reflected power from the plasma chamber and/or the RF match, thereby increasing the power transferred from the RF generator to the plasma chamber and into the plasma process.

Oftentimes the RF generator is run in pulse mode and transmits a pulsing RF signal to the plasma chamber rather than a continuous RF signal. Conventional RF matches, however, cannot be actively tuned while the RF generator is in pulse mode. In one existing implementation, the conventional RF match is tuned while the RF generator is run in continuous mode. Once the RF match is tuned, the impedance of the RF match is fixed, and the RF generator is switched to pulse mode. Although the plasma chamber impedance may vary while the RF generator is running in pulse mode, the RF match impedance remains fixed resulting in reflected power from the chamber. In another implementation, the conventional RF match may continuously follow the phase and magnitude signal from the RF generator, and tune according to an average power of the phase and magnitude signal. This causes the RF match to move to a non-optimum position.

SUMMARY

Embodiments of the disclosure are directed to systems and methods for actively tuning an RF matching network for a plasma processing chamber while the RF generator is running in pulse mode.

Embodiments of the disclosure may provide a method of tuning a first radio frequency ("RF") matching network during a pulsed mode operation. The method may include sensing a pulsing process signal with a phase and magnitude detector circuit. The pulsing process signal may be transmitted from an RF generator to a target in a plasma processing chamber via the first RF matching network. The method may include tracking a magnitude error signal and a phase error signal output by the phase and magnitude detector circuit using at least two sample and hold circuits. The magnitude error signal and the phase error signal may be respectively input to the at least two sample and hold circuits. The method may also include generating a first tracked magnitude signal and a first tracked phase signal corresponding to the magnitude error signal and the phase error signal with a pulse tracking circuit electrically coupled to the phase and magnitude detector circuit. The method may further include tuning the first RF matching network with a match controller electrically coupled to the first RF matching network and the pulse tracking network in response to the first tracked magnitude signal and the first tracked phase signal. The first RF matching network may be tuned while the RF generator transmits the pulsing process signal to the target in the plasma processing chamber via the first RF matching network.

Embodiments of the disclosure may provide a system for tuning a first radio frequency ("RF") matching network during pulsed mode operation. The system may include an RF generator configured to supply a pulsing process signal to a target in a plasma processing chamber via the first RF matching network. The system may include a phase and magnitude detector circuit coupled to the RF generator and configured to sense the pulsing process signal and to output a magnitude error signal and a phase error signal. The system may also include a pulse tracking circuit electrically coupled to the phase and magnitude detector circuit and configured to receive the magnitude error signal and the phase error signal and to output a first tracked magnitude signal and a first tracked phase signal. The system may further include a match controller electrically coupled to the pulse tracking circuit and the first RF matching network and configured to receive the first tracked magnitude signal and the first tracked phase signal and to vary an impedance of the first RF matching network in response to the first tracked magnitude signal and the first tracked phase signal.

Embodiments of the disclosure may provide a method of tuning a first radio frequency ("RF") matching network of a plasma chamber during pulse mode operation. The method may include transmitting a pulsing process signal from an RF generator to the plasma chamber via the first RF matching network. The method may also include sensing the pulsing process signal with a phase and magnitude detector circuit coupled to the RF generator. The method may output a magnitude error signal and a phase error signal with the phase and magnitude detector circuit. Further, the method may include receiving and converting the magnitude error signal and the phase error signal into a first tracked magnitude signal and a first tracked phase signal with a pulse tracking circuit electrically coupled to the phase and magnitude detector circuit. The method may vary an impedance of the first RF matching network with a match controller in response to the first tracked magnitude signal and the first tracked phase signal to reduce reflected power from the plasma chamber. The match controller may be electrically coupled to the pulse tracking circuit and the first RF matching network.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
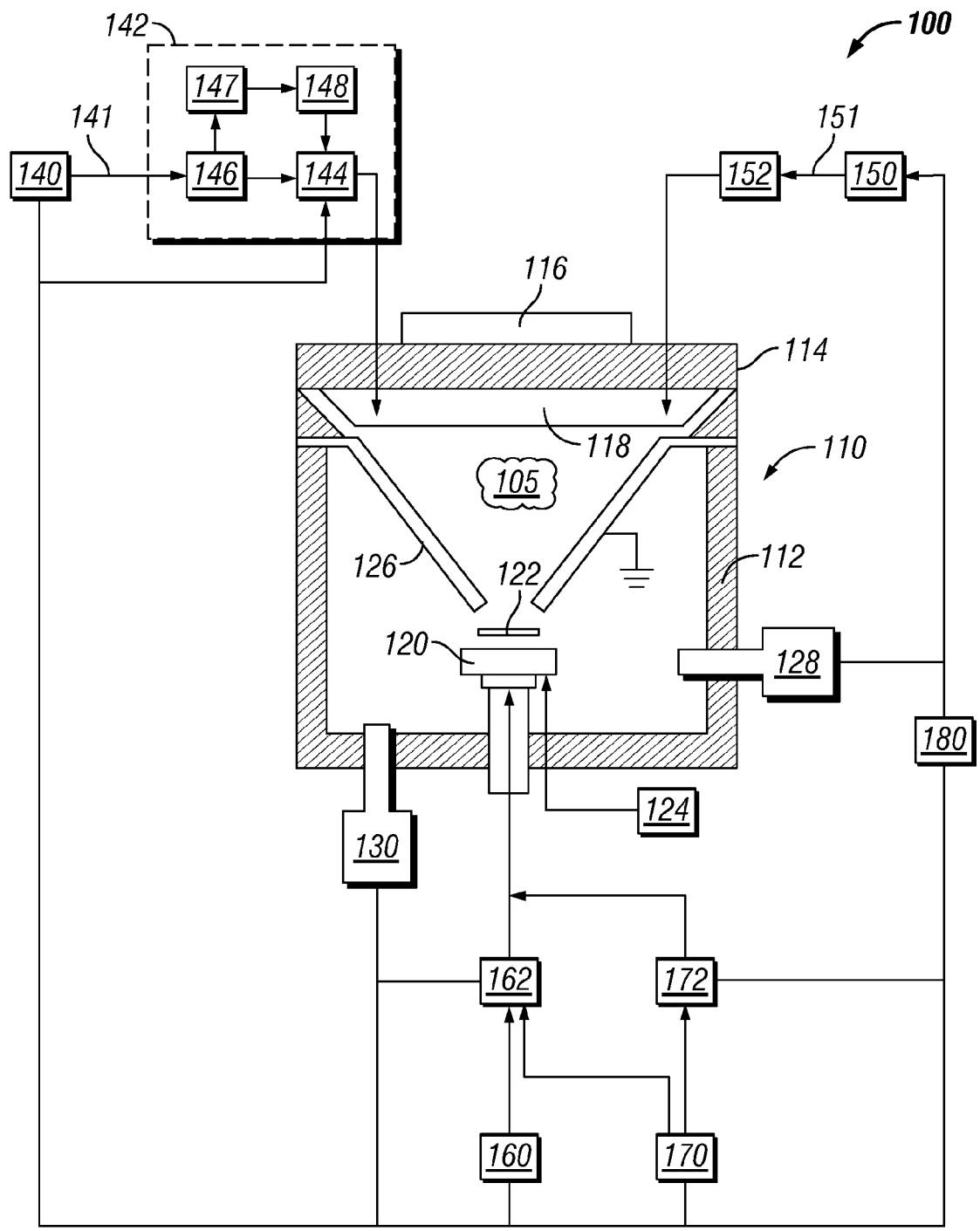
FIG. 1 illustrates an exemplary physical vapor deposition system, according to one or more embodiments described.

It is to be understood that the following disclosure describes several exemplary embodiments for implementing different features, structures, or functions of the invention. Exemplary embodiments of components, arrangements, and configurations are described below to simplify the present disclosure, however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in any combination of ways, i.e., any element from one exemplary embodiment may be used in any other exemplary embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Further, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B," unless otherwise expressly specified herein.

For the sake of explanation, the example embodiments are described as being applied to a physical vapor deposition ("PVD") process. However, example embodiments described below are equally applicable to any plasma process. FIG. 1 illustrates an exemplary physical vapor deposition ("PVD") system 100 of the disclosure. The PVD system 100 includes a chamber 110 having a body 112 and a lid or ceiling 114. An optional magnet assembly 116 may be disposed on an outer side of the lid 114. In at least one embodiment, the magnet assembly 116 may be a permanent magnet disposed on a plate that is rotated by a motor between about 0.1 and about 10 revolutions per second. For example, the magnet assembly 116 may rotate in a counterclockwise direction at about 1 revolution per second.

A target 118 is generally positioned on an inner side of the lid 114 opposite the magnet assembly 116. In at least one embodiment, the target 118 may be at least partially composed of, but is not limited to, elements such as, borides, carbides, fluorides, oxides, silicides, selenides, sulfides, tellurides, precious metals, alloys, intermetallics, or the like. For example, the target 118 may be composed of copper (Cu), silicon (Si), gold (Au), titanium (Ti), tantalum (Ta), tungsten (W), aluminum (Al), a combination or alloy thereof, or the like.

A pedestal 120 may be disposed in the chamber 110 and configured to support a substrate 122. In at least one embodiment, the pedestal 120 includes a chuck configured to hold the substrate 122 to the pedestal 120. Suitable chucks may include mechanical chucks, vacuum chucks, electrostatic chucks ("e-chucks"), or the like. Mechanical chucks include one or more clamps to hold the substrate 122 to the pedestal 120. Vacuum chucks include a vacuum aperture coupled to a vacuum source to hold the substrate 122 to the pedestal 120. E-chucks rely on the electrostatic pressure generated by an electrode to hold the substrate 122 to the pedestal 120. In at least one embodiment, the pedestal 120 may be or include an e-chuck powered by a DC power supply 124.

A shield 126 may at least partially surround the pedestal 120 and the substrate 122 and be electrically grounded, for example, by physical attachment to the chamber body 112. The shield 126 is generally configured to receive deposition particles that would normally deposit on the interior walls of the chamber 110 during the PVD process.

A gas supply 128 may be coupled to the chamber 110 and configured to introduce a controlled flow of a process gas into the chamber 110. In at least one embodiment, the process gas introduced to the chamber 110 may include Argon (Ar), Nitrogen ($N_2$), Hydrogen ($H_2$), Helium (He), Xenon (Xe), a combination thereof, or the like.

A vacuum pump 130 may be coupled to the chamber 110 and configured to maintain a desired sub-atmospheric pressure or vacuum level in the chamber 110. In at least one embodiment, the vacuum pump 130 may maintain a pressure between about 1 millitorrs and about 100 millitorrs in the chamber 110 during a deposition process.

A first radio frequency ("RF") generator 140 may be configured to supply a process signal 141 (for example, an AC signal) at a frequency F1 to the target 118 in the chamber 110. In at least one embodiment, F1 may be between about 300 Hz and about 300 MHz. For example, F1 may be between about 13 MHz and about 162 MHz. The first RF generator 140 may be configured to operate in continuous mode or pulse mode, i.e., the process signal 141 may pulse on and off rather than stream continuously.

A first RF match system 142 may be coupled to the first RF generator 140 and configured to decrease reflected power from the load, i.e., the chamber 110, thereby increasing the power transferred from the first RF generator 140 to the chamber 110. The RF match system 142 may be or include an RF matching network 144 having a variable or adjustable impedance. The power transfer from the first RF generator 140 to the chamber 110 via the RF matching network 144 is maximized when the impedance of the RF matching network 144 is adjusted to equal or approximate the complex conjugate of the impedance of the chamber 110. In at least one exemplary embodiment, when the impedance of the RF matching network 144 reaches the complex conjugate of the impedance of the chamber 110, the first RF generator 140 will see an impedance of about 50 ohms at the input of the RF matching network 144.

A phase and magnitude detector circuit 146 may be coupled to or be part of the RF match system 142. The phase and magnitude detector circuit 146 may be configured to detect or sense the process signal 141 from the first RF generator 140 and to generate a magnitude error signal and a phase error signal representative of the process signal 141.

A pulse tracking circuit 147 may also be coupled to or be part of the RF match system 142. For example, as a part of the RF match system 142, the pulse tracking circuit 147 may be implemented as a part of the phase and magnitude detector circuit 146, or a match controller 148 (described below) or may be situated separately between the phase and magnitude detector circuit 146 and the match controller 148. If the pulse tracking circuit 147 is implemented as a part of the phase and magnitude detector circuit 146 or the match controller 148, the pulse tracking circuit 147 may be implemented in a Field Programmable Gate Array (FPGA) on the phase and magnitude detector circuit 146 or the match controller 148. As a non-limiting embodiment and for the purpose of discussion, FIG. 1 illustrates the pulse tracking circuit 147 situated separately between the phase and magnitude detector circuit 146 and the match controller 148. When the first RF generator 140 is in pulse mode, the pulse tracking circuit 147 may be configured to receive the magnitude error signal and the phase error signal in pulse form output from the phase and magnitude detector circuit 146 and to output a tracked magnitude signal and a tracked phase signal representative of the process signal 141.

The match controller 148 may be coupled to the RF matching network 144, the phase and magnitude detector circuit 146, and/or the pulse tracking circuit 147. In at least one embodiment, the match controller 148 may be coupled to or be part of the RF match system 142. In another embodiment, the match controller 148 may be coupled to or be part of an overall system controller 180. The match controller 148 may be configured to tune, i.e., adjust the impedance, of the RF matching network 144 in response to the magnitude error signal and the phase error signal from the phase and magnitude detector circuit 146 and/or the tracked magnitude signal and the tracked phase signal from the pulse tracking circuit 147 to decrease reflected power from the chamber 110.

A DC generator 150 may supply a DC signal 151 to the target 118. A DC filter 152 may be coupled to the DC generator 150 and configured to block or prevent the process signal 141 and the corresponding harmonics from the first RF generator 140 from reaching and damaging the DC generator 150.

A second RF generator 160 may be configured to supply an RF signal at a frequency to the pedestal 120. The second RF generator 160 may be configured to operate in continuous mode or pulse mode. In at least one embodiment, the RF signal from the second RF generator 160 may be used to bias the chamber 110 and/or the pedestal 120. A second RF match system 162 may be coupled to and receive the signal from the second RF generator 160. The second RF match system 162 may be the same as the first RF match system 142, i.e., a double input match, or it may be a different component, as desired.

In at least one embodiment, a third RF generator 170 may be configured to supply an RF signal at a frequency to the pedestal 120. The third RF generator 170 may be configured to operate in continuous mode and/or pulse mode. In at least one embodiment, the second RF generator 160 and the third RF generator 170 may be coupled to a single RF match system 162. In another embodiment, the third RF generator 170 may be coupled to a third RF match system 172. The third RF match may be the same as the first and/or second RF match system 142, 162, or it may be a different component, as desired. Although not shown, one or more additional RF generators and corresponding RF match systems may be implemented in the PVD system 100.

The system controller 180 may be coupled to one or more of the gas supply 128, the vacuum pump 130, the RF generators 140, 160, 170, and the DC generator 150. In at least one embodiment, the system controller 180 may also be coupled to one or more of the RF match systems 142, 162, 172. The system controller 180 may be configured to the control the various functions of each component to which it is coupled. For example, the system controller 180 may be configured to control the rate of gas introduced to the chamber 110 via the gas supply 128. The system controller 180 may be configured to adjust the pressure within the chamber 110 with the vacuum pump 130. The system controller 180 may be configured to adjust the output signals from the RF generators 140, 160, 170, and/or the DC generator 150. In at least one embodiment, the system controller 180 may be configured to adjust the impedances of the RF match systems 142, 162, 172.

Current supplied to the chamber 110 via the first RF generator 140, the second RF generator 160, the third RF generator 170, the DC generator 150, or any combination thereof, may cooperatively ionize atoms in the inert gas supplied by the gas supply 128 to form a plasma 105 in the chamber 110. Ionized atoms within the plasma 105, which are positively charged, are attracted to and accelerated toward the target 118, which is negatively charged. Upon impact with the target 118, the ionized atoms may dislodge atoms from the target 118. The dislodged atoms become ionized in the plasma 105 and are then accelerated toward the substrate 122 by the magnetic field within the chamber 110.

Figure 2:
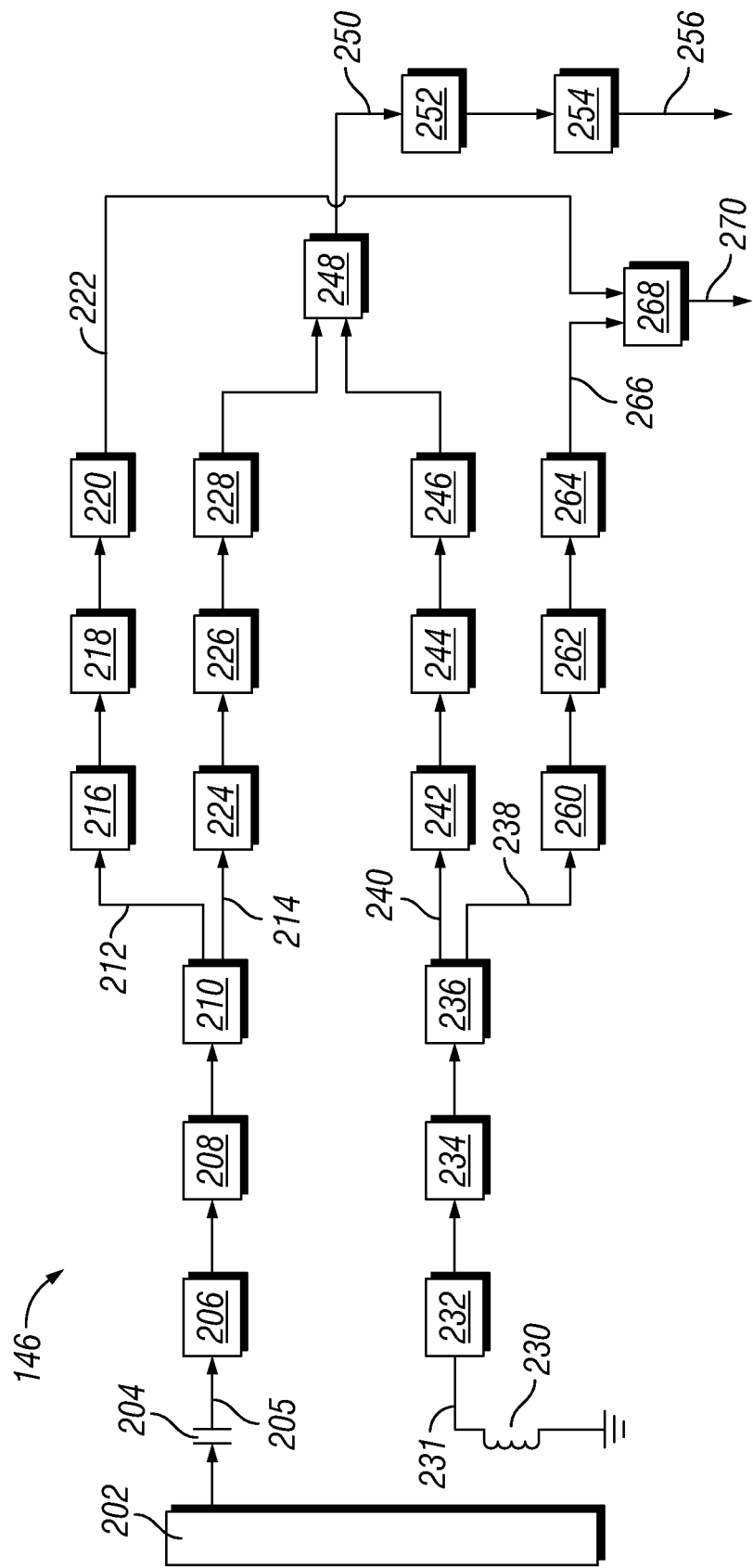
FIG. 2 illustrates an exemplary phase and magnitude detector circuit of FIG. 1, according to one or more embodiments described.

FIG. 2 illustrates an exemplary phase and magnitude detector circuit 146 from FIG. 1, according to one or more embodiments described. The phase and magnitude detector circuit 146 may include a rod 202 or other device coupled to the first RF generator 140 (see FIG. 1) and configured to detect or sense the process signal 141 from the first RF generator 140. A capacitor 204 may be coupled to the rod 202 and configured to pick up an initial AC voltage ($V_{RMS}$) signal 205 from the first RF generator 140 via the rod 202. A voltage scaler 206 may be coupled to the capacitor 204 and configured to scale the $V_{RMS}$ signal 205 received from the capacitor 204, such as with one or more resistors. A low pass filter 208 may be coupled to the voltage scaler 206 and configured to pass frequencies of the scaled $V_{RMS}$ signal 205 below a cutoff frequency and to attenuate frequencies above the cutoff frequency.

A power splitter 210 may be coupled to the low pass filter 208 and configured to split the $V_{RMS}$ signal 205 from the low pass filter 208 and output a first $V_{RMS}$ signal 212 and a second $V_{RMS}$ signal 214. In at least one embodiment, the power splitter 210 may be or include a telecommunications integrated circuit (telecom IC) having wide bandwidth capabilities. For example, the telecom IC may be operable at variable frequencies between about 400 kHz and 3 GHz. In at least one embodiment, rather than creating the second $V_{RMS}$ signal 214 with the power splitter 210, a second capacitor, voltage scaler, and low pass filter (not shown) may be placed in parallel with the capacitor 204, scaler 206, and low pass filter 208 to create the second $V_{RMS}$ signal 214.

A voltage scaler 216 may be coupled to the power splitter 210 and configured to receive and scale the first $V_{RMS}$ signal 212 from the power splitter 210. The voltage scaler 216 may be the same as the voltage scaler 206, or it may be a different component, as desired. A clamp 218 may be coupled to the voltage scaler 216 and configured to clamp any overshoot and/or undershoot of the first $V_{RMS}$ signal 212 from the voltage scaler 216. A converter 220 may be coupled to the clamp 218 and configured to convert the first $V_{RMS}$ signal 212 from the clamp 218 to a voltage magnitude signal 222 in DC form. In at least one embodiment, the converter 220 may be a high frequency, low voltage, linear responding RMS to DC power converter. In at least one embodiment, the converter 220 may be or include a telecom IC having wide bandwidth capabilities. The telecom IC in the converter 220 may be the same as the telecom IC in the power splitter 210, or it may be a different component, as desired.

An attenuator 224 may be coupled to the power splitter 210 and configured to reduce the amplitude and/or power of the second $V_{RMS}$ signal 214 from the power splitter 210 without appreciably distorting its waveform. A clamp 226 may be coupled to the attenuator 224 and configured to clamp any overshoot and/or undershoot of the second $V_{RMS}$ signal 214 from the attenuator 224. A band pass filter 228 may be coupled to the clamp 226 and configured to pass frequencies of the second $V_{RMS}$ signal 214 from the clamp 226 within a set range and attenuate frequencies outside the set range.

An inductor 230 may be coupled to the rod 202 and configured to pick up an initial AC current ($I_{RMS}$) signal 231 from the first RF generator 140 via the rod 202. A current scaler 232 may be coupled to the inductor 230 and configured to scale the $I_{RMS}$ signal 231 received from the inductor 230. A low pass filter 234 may be coupled to the current scaler 232 and configured to pass frequencies of the scaled $I_{RMS}$ signal 231 from the current scaler 232 below a cutoff frequency and to attenuate frequencies above the cutoff frequency. A power splitter 236 may be coupled to the low pass filter 234 and configured to split the $I_{RMS}$ signal 231 from the low pass filter 234 and output a first $I_{RMS}$ signal 238 and a second $I_{RMS}$ signal 240. In at least one embodiment, the scaler 232, low pass filter 234, and/or power splitter 236 may be the same as the scaler 206, low pass filter 208, and/or power splitter 210, or they may be different, as desired. In at least one embodiment, rather than creating the second $I_{RMS}$ signal 240 with the power splitter 236, a second inductor, current scaler, and low pass filter (not shown) may be placed in parallel with the inductor 230, current scaler 232, and low pass filter 234 to create the second $I_{RMS}$ signal 240.

An attenuator 242 may be coupled to the power splitter 236 and configured to receive the second $I_{RMS}$ signal 240 from the power splitter 236 and to reduce the amplitude and/or power of the second $I_{RMS}$ signal 240 without appreciably distorting its waveform. A clamp 244 may be coupled to the attenuator 242 and configured to clamp any overshoot and/or undershoot of the second $I_{RMS}$ signal 240 from the attenuator 242. A band pass filter 246 may be coupled to the clamp 244 and configured to pass frequencies of the second $I_{RMS}$ signal 240 from the clamp 244 within a set range and attenuate frequencies outside the set range. In at least one embodiment, the attenuator 242, clamp 244, and/or band pass filter 246 may be the same as the attenuator 224, clamp 226, and/or band pass filter 228, or they may be different components, as desired.

A phase detector 248 may be coupled to the band pass filters 228, 246 and configured to receive the second $V_{RMS}$ signal 214 from the band pass filter 228 and the second $I_{RMS}$ signal 240 from the band pass filter 246 and to output a phase difference signal 250 in DC form that corresponds to the phase difference in degrees or radians between the second $V_{RMS}$ signal 214 and the second $I_{RMS}$ signal 240. In at least one embodiment, the phase detector 248 may be an RF/IF gain/phase detector. In at least one embodiment, the phase detector 248 may be or include a telecom IC having wide bandwidth capabilities. The telecom IC in the phase detector 248 may be the same as the telecom IC in the power splitter 210, the power splitter 236, and/or the converter 220, or it may be different, as desired.

A buffer 252 may be coupled to the phase detector 248, and a scaler 254 may be coupled to the buffer 252 and configured to scale the phase difference signal 250. The scaler 254 may be the same as one or more of the scalers 206, 216, 232, or it may be different, as desired. The scaler 254 may be configured to output a phase error signal 256 in DC form that corresponds to the phase error between the second $V_{RMS}$ signal 214 and the second $I_{RMS}$ signal 240.

A scaler 260 may be coupled to the power splitter 236 and configured to receive and scale the first $I_{RMS}$ signal 238 from the power splitter 236. A clamp 262 may be coupled to the scaler 260 and configured to clamp any overshoot and/or undershoot of the first $I_{RMS}$ signal 238 from the scaler 260. A converter 264 may be coupled to the clamp 262 and configured to convert the first $I_{RMS}$ signal 238 from the clamp 262 to a current magnitude signal 266 in DC form. In at least one embodiment, the converter 264 may be high frequency, low voltage, linear responding RMS to DC power converter. In at least one embodiment, the converter 264 may be or include a telecom IC having wide bandwidth capabilities. The telecom IC in the converter 264 may be the same as the telecom IC in the power splitter 210, the converter 220, the power splitter 236, and/or the phase detector 248, or it may be a different component, as desired. In at least one embodiment, the scaler 260, clamp 262, and/or converter 264 may be the same as the scaler 216, clamp 218, and/or converter 220, or they may be different components, as desired.

A multiplier 268 may be coupled to the converters 220 and 264 and configured to receive the voltage magnitude signal 222 from the converter 220 and the current magnitude signal 266 from the converter 264 and to output a magnitude error signal 270 in DC form. In at least one embodiment, the multiplier 268 may be a 4 quadrant multiplier. In at least one embodiment, the multiplier 268 may be or include a telecom IC having wide bandwidth capabilities. The telecom IC in the multiplier 268 may be the same as the telecom IC in the power splitter 210, the converter 220, the power splitter 236, the phase detector 248, and/or the converter 264, or it may be a different component, as desired.

Figure 3:
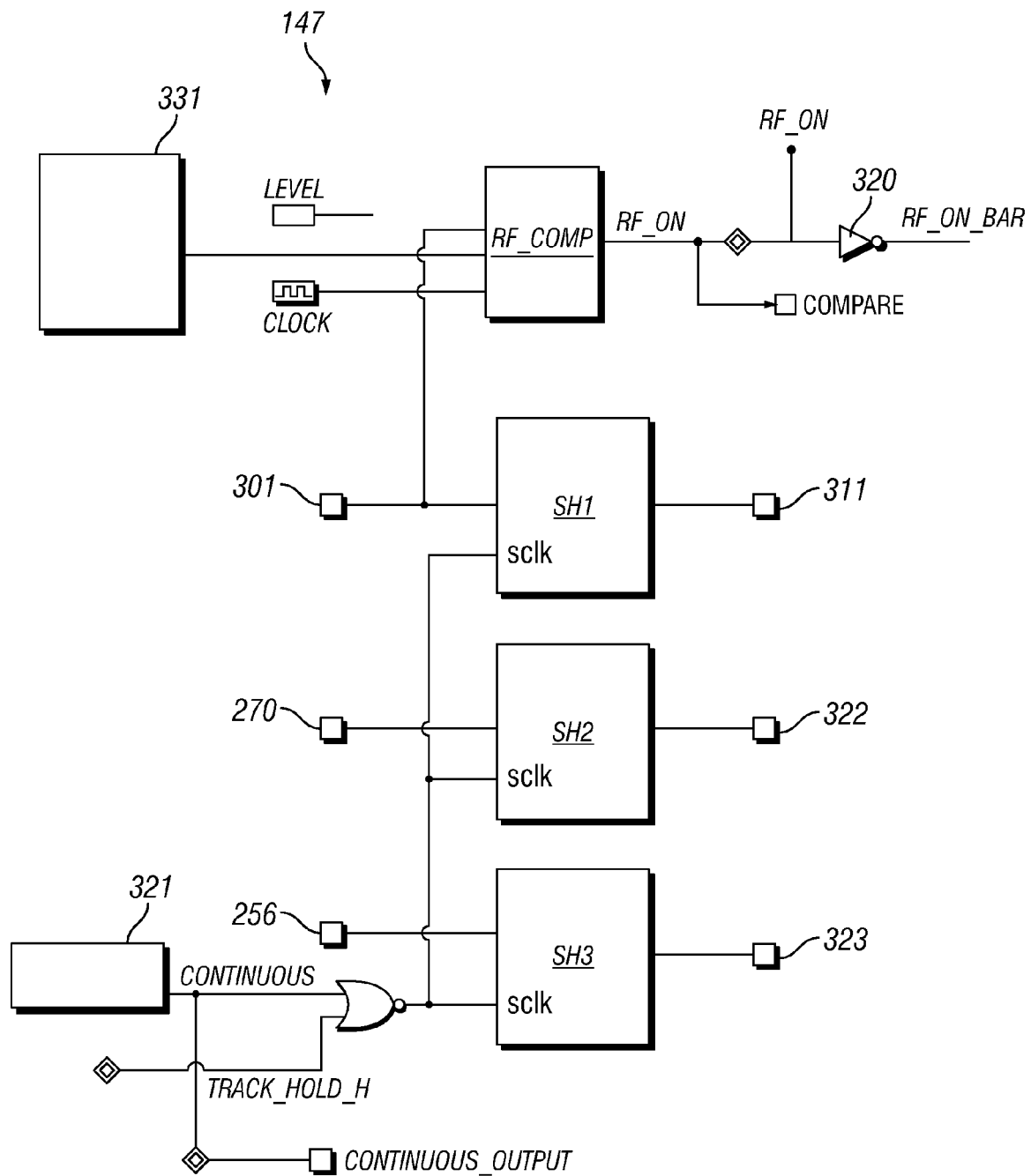
FIG. 3 illustrates an exemplary pulse tracking circuit of FIG. 1, according to one or more embodiments described.

FIG. 3 illustrates an exemplary pulse tracking circuit 147 from FIG. 1, according to one or more embodiments described. The pulse tracking circuit 147 may include sample and hold circuits SH1, SH2, and SH3. In an example embodiment, one or more track and hold circuits may be used in place of all or some of the sample and hold circuits in FIG. 3. The sample and hold circuits SH1, SH2 and SH3 may respectively receive a forward power input signal 301, the magnitude error signal 270 (FIG. 2) and phase error signal 256 (FIG. 2) from the phase and magnitude detector circuit 146. The forward power input signal 301 may be derived from the voltage magnitude signal 222 and current magnitude signal 266. The sample and hold circuits SH1, SH2 and SH3 may respectively output a tracked RF power output signal 311, a tracked magnitude signal 322 and a tracked phase signal 323. The tracked RF power output signal 311, the tracked magnitude signal 322, and the tracked phase signal 323 may be input to the match controller 148 and/or the RF matching network 144 (FIG. 1).

Figure 4:
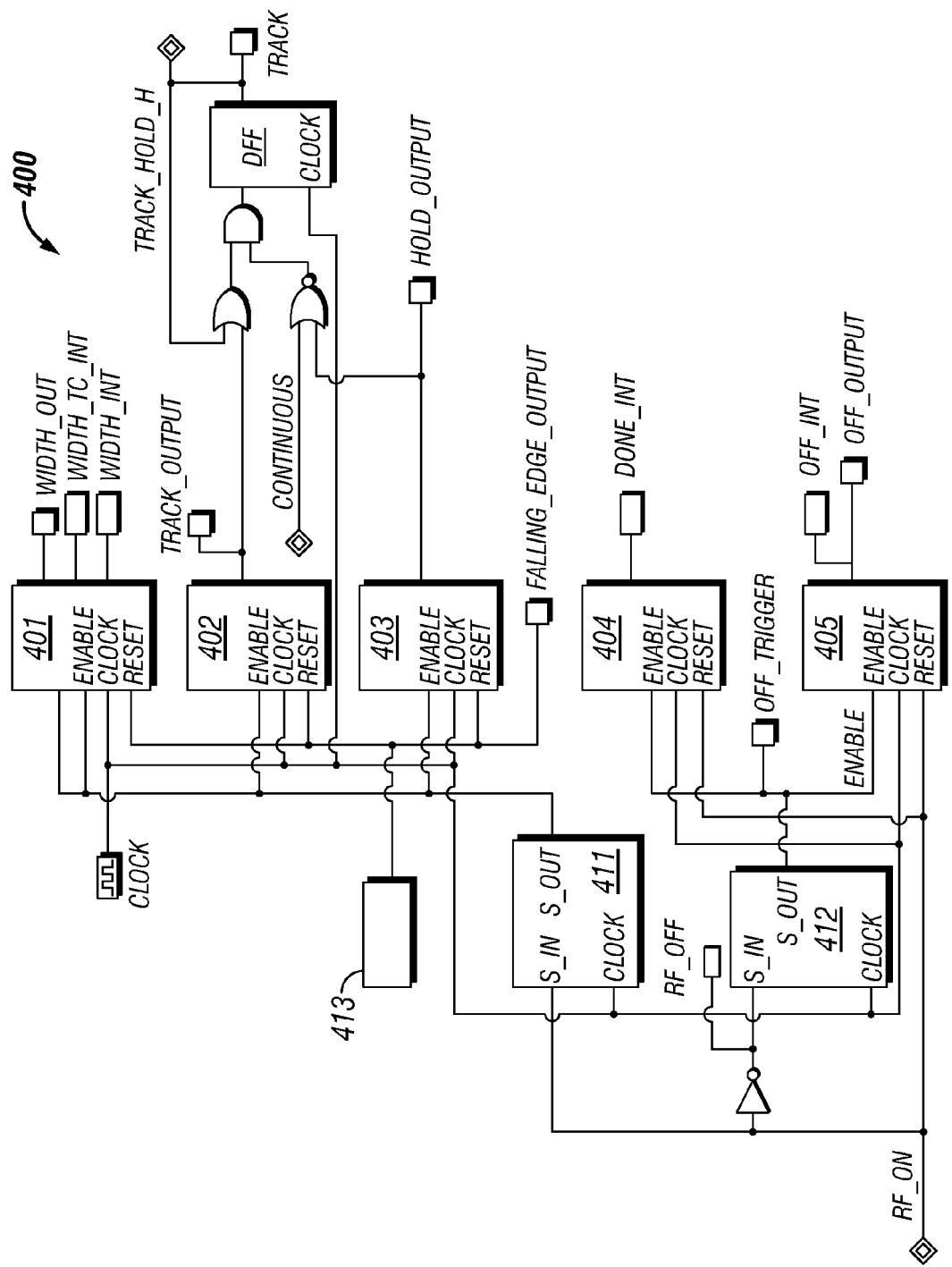
FIG. 4 illustrates an exemplary timing circuit of the pulse tracking circuit of FIG. 3, according to one or more embodiments described.

The sample and hold circuits SH1, SH2, and SH3 may be provided with respective sampling clocks at their respective clock inputs sclk. The sampling clocks may be derived (for example, by using logic gates) from the output of a control register 321 and a timing signal Track_Hold_H of a D flip-flop DFF (FIG. 4). The output of the control register 321 is also provided as an output pin CONTINUOUS_OUTPUT of the chip including the pulse tracking circuit 147. The output pin CONTINUOUS_OUTPUT may be used for diagnostic and/or debugging purposes. The pulse tracking circuit 147 also may include a RF pulse comparator RF_COMP that is supplied with the forward power input signal 301, a system clock CLOCK having a frequency of, for example, 1 MHz, and an output of a digital-to-analog converter (DAC) 331. The RF pulse comparator RF_COMP outputs a signal RF_ON. The signal RF_ON is also provided as an output pin COMPARE of the chip including the pulse tracking circuit 147. The output pin COMPARE may be used for diagnostic and/or debugging purposes.

In an example embodiment, the RF pulse comparator RF_COMP may be supplied with an input pin LEVEL. When supplied, the DAC 331 may not be required. The input pin LEVEL may receive an input from the match controller 148. For example, in a vapor deposition process (or any plasma process), the DAC 331 may have a fixed value and the process signal 141 may vary between 0 to 400 Watts (W) and may, for example, be referred to as a 1-level process signal. In such instance, the process signal 141 is considered ON for any value above 200 W as set by the DAC. However, in another exemplary vapor deposition process (or plasma process), the process signal 141 may vary between two non-zero positive levels, for example, between 50 W to 1000 W or between 300 W to 2000 W, and may, for example, be referred to as a 2-level signal.

In such instances, the process signal does not turn off completely and the 50 W and the 300 W values may be considered the OFF values. In such a case, the DAC 331 may not function correctly. In such a case, the DAC 331 is not used and the input pin LEVEL receives an input from the match controller 148 indicating a value in between (for example, approximately half way) the high level (for example, 1000 W, 2000 W) and the low level (for example, 50 W, 300 W) of the process signal. The in-between value may indicate a boundary between an ON and an OFF level of the process signal. For example, for a 400 W to 1000 W signal, 600 W may be considered as the in-between value and the input pin LEVEL may be set at 600 W. At or above 600 W the process signal is considered ON and below 600 W the process signal is considered OFF. This arrangement, however, may require that the match controller 148 be supplied with the levels of the pulses in the process signal.

In an example embodiment, a digital communication channel (described below) from the match controller 148 to the pulse tracking circuit 147 may set the value of the DAC, thereby eliminating the need for the LEVEL signal. Although example embodiments disclose sampling (or tracking) the forward power input signal 301, the magnitude error signal 270 and phase error signal 256, sample and hold operations may also be performed on any other desired signal(s) from the phase and magnitude detector circuit 146 to tune the match controller 148 and/or the RF matching network 144. The signal(s) to choose to perform sample and hold operations is a design preference. Further, instead of the magnitude and phase error signals, signals derived from active and reactive components of the process signal 141 may also be utilized.

FIG. 4 illustrates an exemplary timing circuit 400 of the pulse tracking circuit 147 that provides the timing signal Track_Hold_H from the D flip-flop DFF, according to one or more embodiments described. As mentioned above, the output Track_Hold_H is a timing signal that is input as a sampling clock at the respective clock inputs sclk of each of the sample and hold circuits SH1, SH2, and SH3. The timing circuit 400 includes a pulse width timer 401, a delay-to-track timer 402, a delay-to-hold timer 403, a DONE timer 404, and an OFF timer 405. The outputs from the delay-to-track timer 402 and the delay-to-hold timer 403 are provided to the D flip-flop DFF through a combination of logic gates. Also, provided through the combination of logic gates is the signal CONTINUOUS from the control register 321. It should be noted that the width of the timers (for example, the bit size) is a design choice and may be chosen as per design preferences.

The timing circuit 400 further includes two synchronization circuits 411 and 412, and control register 413. The two synchronization circuits 411 and 412 may be implemented using flip-flops or the like. The synchronization circuits 411 and 412 synchronize the RF_ON signal output from the RF pulse comparator RF_COMP (FIG. 3) to an internal system clock. The signal RF_ON is provided to the input S_IN of the synchronization circuit 411 and an inverted version of the signal RF_ON is provided as the input S_IN of the synchronization circuit 412. However, this arrangement is an example and an inverted version of the signal RF_ON may be provided to the input S_IN of the synchronization circuit 411 and the signal RF_ON may be provided to the input S_IN of the synchronization circuit 412. The signal RF_ON is also provided as a reset signal to the DONE timer 404 and the OFF timer 405. The output S_OUT of the synchronization circuit 411 is provided as an enable signal to the pulse width timer 401, the delay-to-track timer 402, and the delay-to-hold timer 403. The output S_OUT of the synchronization circuit 412 is provided as an enable signal to the DONE timer 404 and the OFF timer 405.

Although, two synchronization circuits 411 and 412 are illustrated in FIG. 4, according to an example embodiment, only one synchronization circuit may be used and an inverted version of the output S_OUT of the synchronization circuit may be provided as the enable signal to either the DONE timer 404 and the OFF timer 405, or the pulse width timer 401, the delay-to-track timer 402, and the delay-to-hold timer 403.

The two synchronization circuits 411 and 412, the pulse width timer 401, the delay-to-track timer 402, the delay-to-hold timer 403, the DONE timer 404 and the OFF timer 405 are all provided with the internal system clock (for example, a derived system clock) having a frequency of 1 MHz. The frequency of the system clock may be variable. The control register 413 provides a reset signal to the pulse width timer 401, the delay-to-track timer 402, and the delay-to-hold timer 403.

The pulse width timer 401 outputs a first interrupt signal WIDTH_INT. When the first interrupt signal WIDTH_INT is asserted, the output of the control register 413 goes high and low (for example, a pulse under software control) and resets the pulse width timer 401, the delay-to-track timer 402, and the delay-to-hold timer 403, thereby preparing the pulse width timer 401, the delay-to-track timer 402, and the delay-to-hold timer 403 for the next pulse of the process signal 141. The first interrupt signal WIDTH_INT is triggered on the falling edge of the pulse of the process signal being tracked. The pulse width timer 401 outputs a second interrupt signal WIDTH_TC_INT that indicates that a pulse of the process signal 141 being measured is a continuous signal, is longer than a predetermined value and/or cannot be measured. The count in the pulse width timer 401 indicates the width of the pulse via the output signal WIDTH_OUT.

The DONE timer 404 outputs a signal DONE_INT when a time between adjacent pulses of the process signal 141 is longer than, for example, 0.5 seconds. If the time is greater than 0.5 seconds, it may be determined that the RF process has been completed, and the match controller 148 and/or the RF matching network 144 are instructed, for example, to turn off motors that control variable capacitors in the RF matching network 144.

The OFF timer 405 and outputs a signal OFF_INT when a time gap between two adjacent pulses of the process signal 141 is longer than a desired value. When such a time gap occurs, the match controller 148 is programmed to assume that the information regarding the phase and magnitude error signals 256, 270 is "stale," and that this information would detune the RF matching network 144 if acted upon by the match controller 148, and should therefore be ignored. In this instance, the OFF timer 405 sets the RF forward power to zero, and the match controller 148 assumes that the first RF generator 140 is turned off (although the next pulse of the process is expected shortly) and does not provide any signals to the RF matching network 144. After about a quarter of the width into the next pulse of the process signal, the D flip-flop DFF is triggered into the track position, and the tracking of the phase and magnitude error signals 256, 270 continues.

The signals WIDTH_OUT, TRACK_OUTPUT, TRACK, HOLD_OUTPUT, FALLING_EDGE_OUTPUT, OFF_TRIGGER, and/or OFF_OUTPUT are provided as output pins of a chip including the pulse tracking circuit 147 and are used for diagnostic and/or debugging purposes.

In an operation, a first pulse of the pulse train of the process signal 141 triggers the pulse width timer 401 on the rising edge of the first pulse and the timer counts down (or up) (considered as an initial value of the timer) and quits counting at the falling edge of the first pulse. The value at which the pulse width timer 401 quits counting (the final count) is read and a difference between the initial value and the final value is calculated. This difference value may be the width of the first pulse. For example, if the pulse width timer 401 is running at 1 microsecond per step, the difference value represents the width of the pulse in microseconds. Based on the width of the pulse, it may be determined how far into the first pulse (time from the rising edge of the first pulse) the tracking of the phase and magnitude error signals 256, 270 obtained from the phase and magnitude detector circuit 146 (FIG. 1) may commence. After being tracked, the phase and magnitude error signals 256, 270 are output from the sample and hold circuits SH1, SH2, and SH3 as a tracked magnitude signal 322 and a tracked phase signal 323. The tracked magnitude signal 322 and the tracked phase signal 323 may be input to the match controller 148 (FIG. 1). The forward power input signal 301 that is obtained from the phase and magnitude detector circuit 146 is also sent to the match controller 148 as the RF power output signal 311. It should be noted that the forward power input signal 301 follows the first RF generator 140.

A few pre-determined microseconds (for example, around 12 microseconds) are subtracted from the width of the pulse and the subtracted value is set in the delay-to-hold timer 403. A quarter of the width of the first pulse is obtained (for example, by entering the pulse width value in a shift register and right shifting the contents of the register 2 places) and the obtained value is input in the delay-to-track timer 402. Alternatively, the input to the delay-to-track timer 402 may be either a pre-determined value or a value equal to a minimum of one clock cycle. Both, the delay-to-track timer 402 and the delay-to-hold timer 403, begin counting down at the beginning of the next pulse of the process signal 141. When the delay-to-track timer 402 and the delay-to-hold timer 403 reach zero, the D flip-flop DFF is triggered. The D flip-flop DFF is triggered via a manipulation of the outputs of the delay-to-track timer 402 and the delay-to-hold timer 403 after the zero count is reached, and the output CONTINUOUS of the control register 321 (FIG. 3) using a combination of logic gates. The D flip-flop DFF outputs the timing signal TRACK_HOLD_H that is provided to the sample and hold circuits SH1, SH2, and SH3.

It should be noted that the count in the delay-to-track timer 402 reaches zero before the count in the delay-to-hold timer 403 and, upon reaching zero, the delay-to-track timer 402 sets the D flip-flop DFF in the track or sample position (in turn setting the sample and hold circuits SH1, SH2 and SH3 in the sample position). The delay-to-hold timer 403 may expire prior to the end of the next pulse and reset the D flip-flop DFF to the hold position (in turn setting the sample and hold circuits SH1, SH2 and SH3 in the hold position). A desired time, for example around 12 microseconds, after the D flip-flop DFF goes in the hold state, the pulse width timer 401 will again trigger on the rising edge of the subsequent pulse and the above operations will be repeated.

Figure 5:
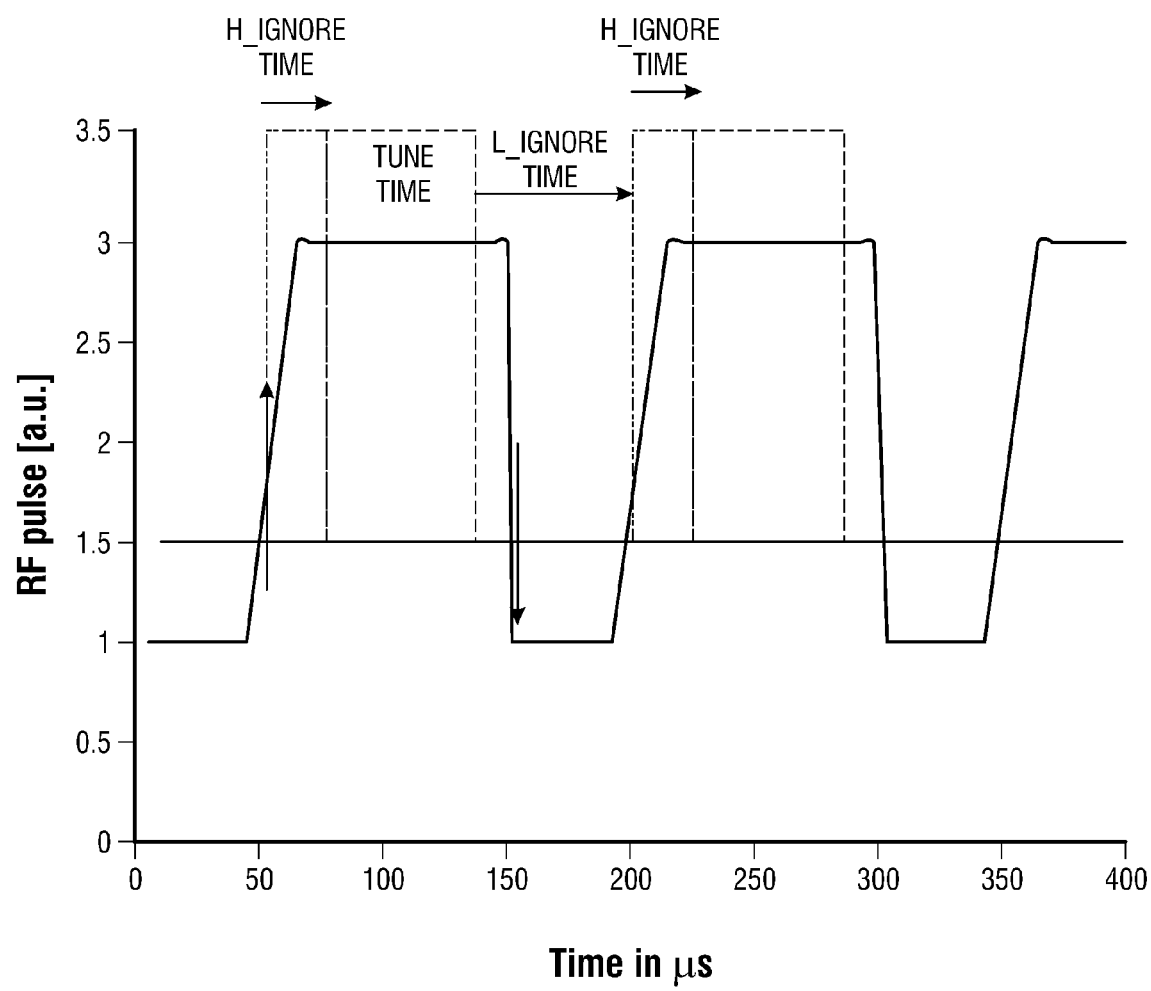
FIG. 5 illustrates an example radio frequency ("RF") pulse envelope generated by an RF generator of FIG. 1, according to one or more embodiments described.

FIG. 5 illustrates an example RF pulse generated by the first RF generator 140. The RF pulse has a low value of 1 arbitrary unit (AU) and a high value of 3 AU. When the rising edge of the RF pulse reaches around 1.5 AU, and after a time set in the delay-to-track timer 402 (see above) has elapsed, a tracking operation may commence. The H_IGNORE TIME in FIG. 5 may correspond to the time set in the delay-to-track timer 402 at the start of the tracking operation (see above). The H_IGNORE TIME is a time between the rise of the pulse and the beginning of tracking of the magnitude and pulse error signals (for example, signals 256 and 270). The tracking of the magnitude and pulse error signals lasts for the duration of the TUNE TIME in FIG. 5. After the TUNE TIME has elapsed, the D flip-flop DFF (FIG. 4) is reset to the hold position till the rising edge of the next pulse is detected. This time between the resetting of the D flip-flop and the rising edge of the next RF pulse (calculated when the RF pulse reaches around 1.5 AU) is calculated as an L_IGNORE TIME. During the L_IGNORE TIME the RF pulse is considered to be at a low power level (considered off). During the L_IGNORE TIME, the magnitude and phase error signal values and the forward power values obtained from the phase and magnitude detector are retained.

Figure 6:
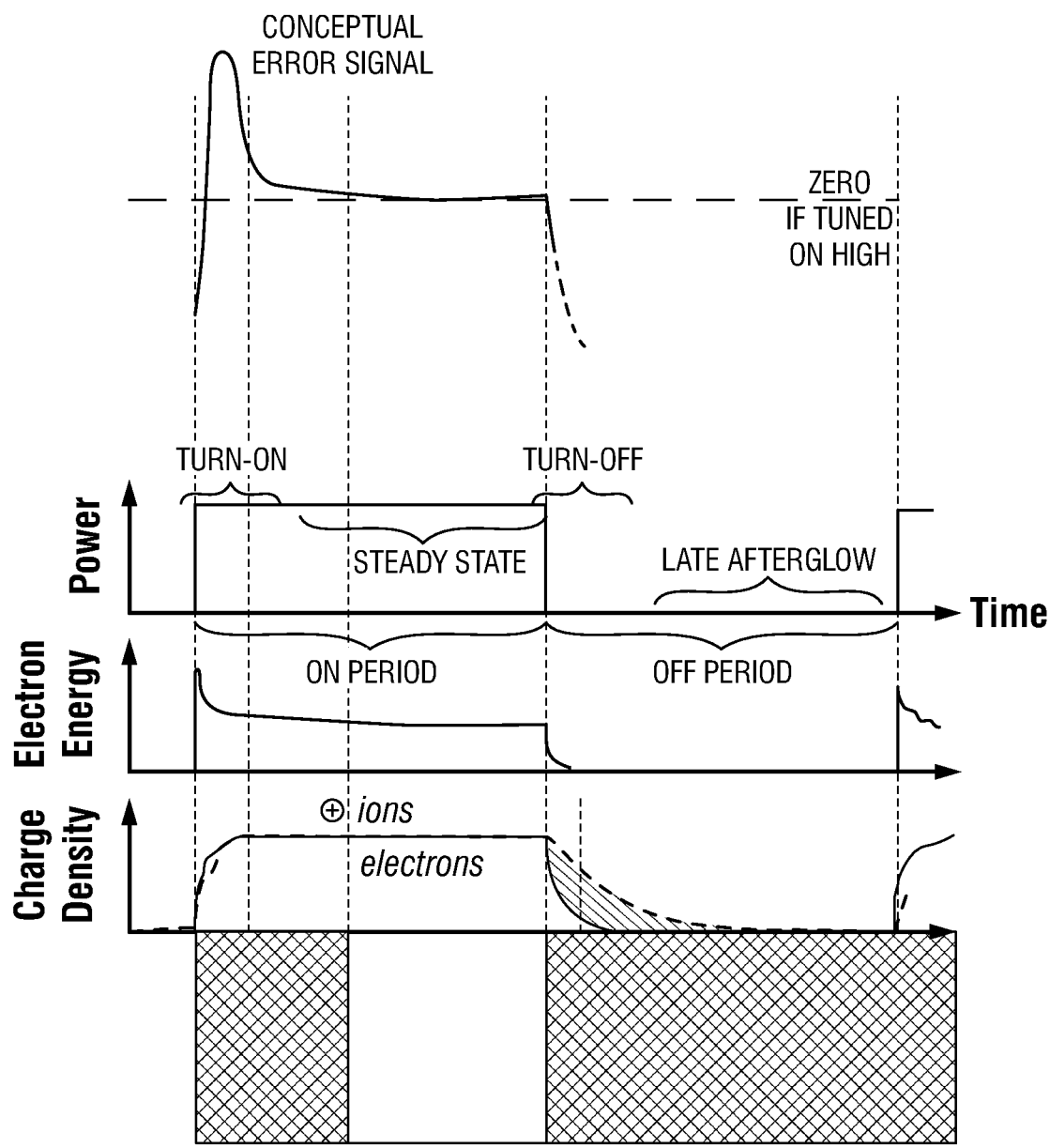
FIG. 6 illustrates an example phase error signal or a magnitude error signal, according to one or more embodiments described.

FIG. 6 illustrates an example phase error signal or a magnitude error signal. The phase error signal or a magnitude error signal may exhibit a glitch near the rising portion prior to settling to a steady state. The glitch is exhibited when power is turned on. The phase error signal or a magnitude error signal is sampled during all or a portion of the steady state. At all other times, a previous (for example, most recent) value of the phase error signal or a magnitude error signal is retained. FIG. 6 also illustrates the variation of the power of the RF pulse when turned on (ON PERIOD) and when turned off (OFF PERIOD). FIG. 6 also illustrates the electron energy during the ON PERIOD and the OFF PERIOD. As is seen, the electron energy increases during the power on period and decreases during the power off period. The charge density is also illustrated as increasing (for example, gradually) during the power on period and decreasing (for example, gradually) when the power is turned off. The late afterglow relates to the physics of the plasma. Briefly, when the power of the RF pulse goes off, electrons fall to a low energy state and emit light during the transition to the low energy state.

Figure 7:
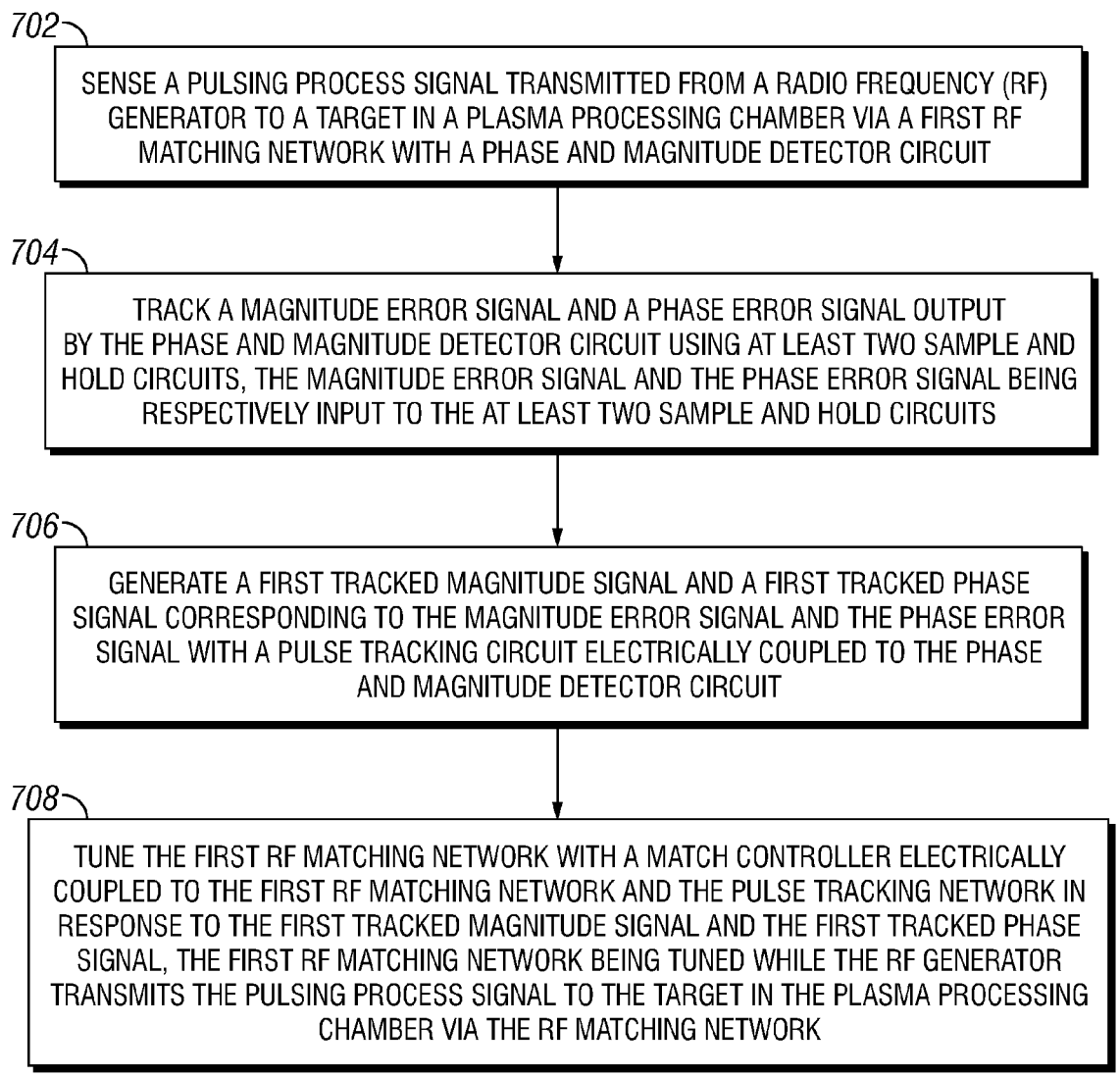
FIG. 7 illustrates an exemplary method of tuning an RF matching network during a pulsed mode operation, according to one or more embodiments described.

FIG. 7 illustrates an exemplary method 700 of tuning a first RF matching network during a pulsed mode operation, according to one or more embodiments described. The method may include sensing a pulsing process signal with a phase and magnitude detector circuit, as shown in 702. The pulsing process signal may be transmitted from an RF generator to a target in a plasma processing chamber via the first RF matching network. The method 700 may also include tracking a magnitude error signal and a phase error signal output by the phase and magnitude detector circuit using at least two sample and hold circuits, as shown in 704. The magnitude error signal and the phase error signal may be respectively input to the at least two sample and hold circuits. The method may also include generating a first tracked magnitude signal and a first tracked phase signal corresponding to the magnitude error signal and the phase error signal with a pulse tracking circuit electrically coupled to the phase and magnitude detector circuit, as shown in 706. The method may further include tuning the first RF matching network with a match controller electrically coupled to the first RF matching network and the pulse tracking network in response to the first tracked magnitude signal and the first tracked phase signal, as shown in 708. The first RF matching network may be tuned while the RF generator transmits the pulsing process signal to the target in the plasma processing chamber via the first RF matching network.

Figure 8:
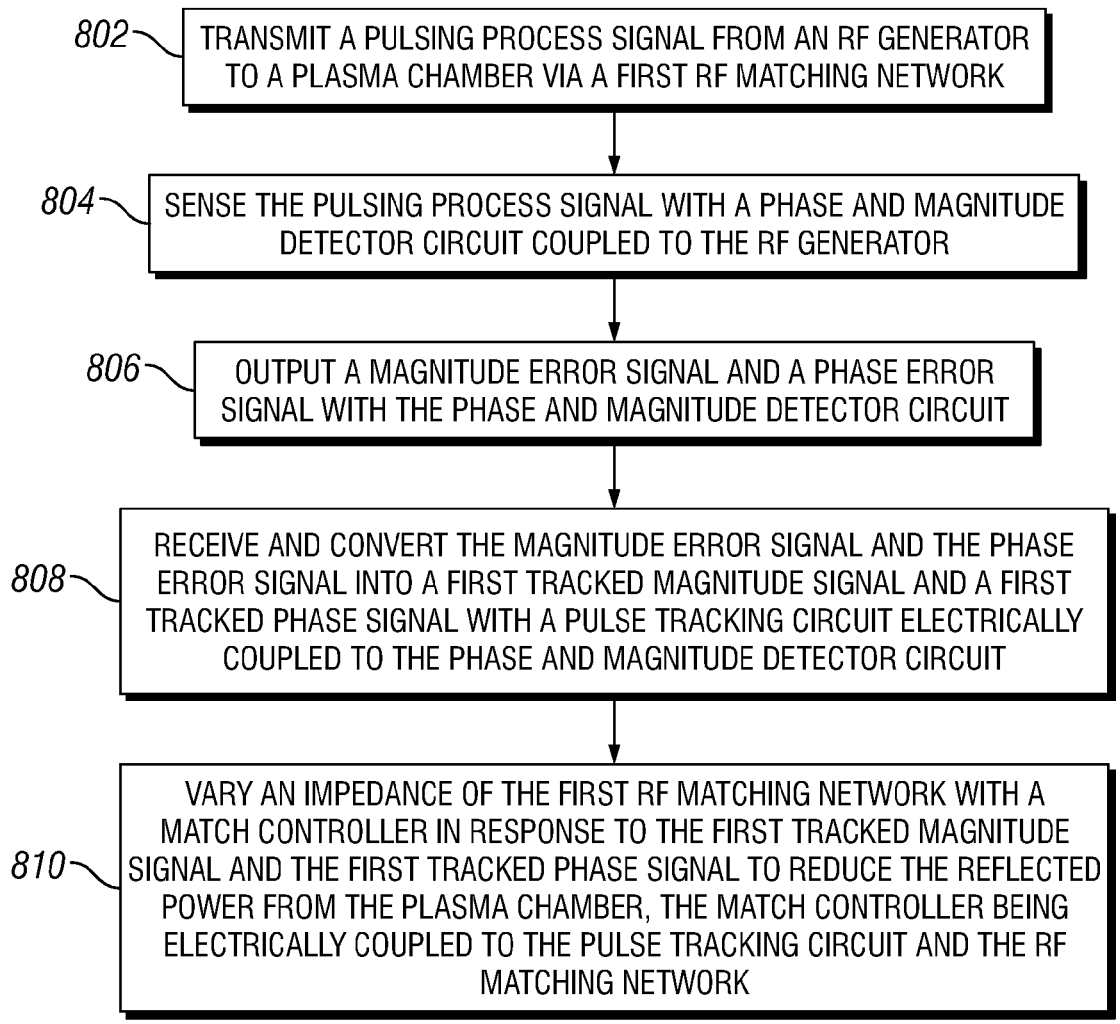
FIG. 8 illustrates another exemplary method of tuning an RF matching network during a pulsed mode operation, according to one or more embodiments described.

FIG. 8 illustrates an exemplary method 800 of tuning a first RF matching network during a pulsed mode operation, according to one or more embodiments described. The method may include transmitting a pulsing process signal from an RF generator to a plasma chamber via the first RF matching network, as shown in 802. The method may sense the pulsing process signal with a phase and magnitude detector circuit coupled to the RF generator, as shown in 804, and may output a magnitude error signal and a phase error signal with the phase and magnitude detector circuit, as shown in 806. The method may also include receiving and converting the magnitude error signal and the phase error signal into a first tracked magnitude signal and a first tracked phase signal with a pulse tracking circuit electrically coupled to the phase and magnitude detector circuit, as shown in 808. The method may further include varying an impedance of the first RF matching network with a match controller in response to the first tracked magnitude signal and the first tracked phase signal to reduce reflected power from the plasma chamber, as shown in 810. The match controller may be electrically coupled to the pulse tracking circuit and the first RF matching network.

The pulse tracking circuit 147 may receive the phase error signal 256 and the magnitude error signal 270 from the phase and magnitude detector circuit 146, and based on the signals 256, 270, the pulse tracking circuit 147 may output the tracked magnitude signal 322 and the tracked phase signal 323 to the match controller 148. The match controller 148 may actively adjust the impedance of the RF matching network 144 while the RF generator is running in pulse mode. In at least one embodiment, the match controller 148 may adjust the impedance of the RF matching network 144 by adjusting variable components within the RF matching network 144. In at least one embodiment, the variable components may be adjusted using adjusting or actuating devices, e.g., stepper motors or the like, that are controlled by one or more controllers, such as the match controller 148 or the system controller 180. In at least one embodiment, the variable components may be or include variable capacitors. As a result, the RF matching network 144 may be tuned to increase power transfer efficiency from the first RF generator 140 to the chamber 110.

Figure 9:
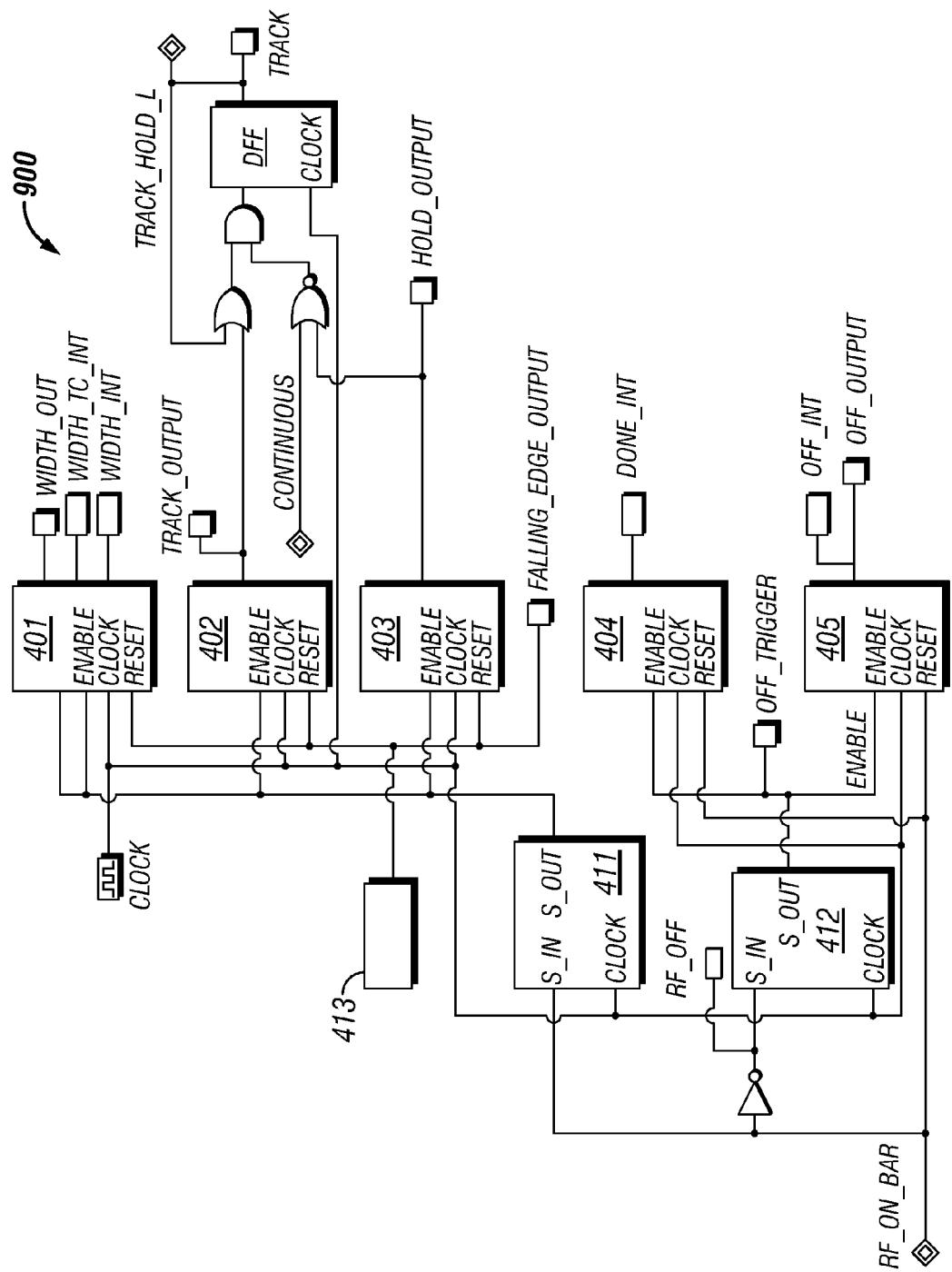
FIG. 9 illustrates another exemplary timing circuit, according to one or more embodiments described.

In an example embodiment, wherein the LEVEL signal is not used and the process signal is a 2-level signal (as mentioned above), the signal RF_ON output from the RF pulse comparator RF_COMP may be inverted using an inverter 320 to obtain the signal RF_ON_BAR. The signal RF_ON_BAR may be provided to another timing circuit 900 (FIG. 9), which may be a duplicate of the timing circuit 400 illustrated in FIG. 4 above. As seen, the timing circuit 900 of FIG. 9 may receive the signal RF_ON_BAR and output a timing signal TRACK_HOLD_L. The timing signal TRACK_HOLD_L output in FIG. 9 may be provided to a second set of sample and hold circuits SH1L, SH2L, and SH3L.

Figure 10:
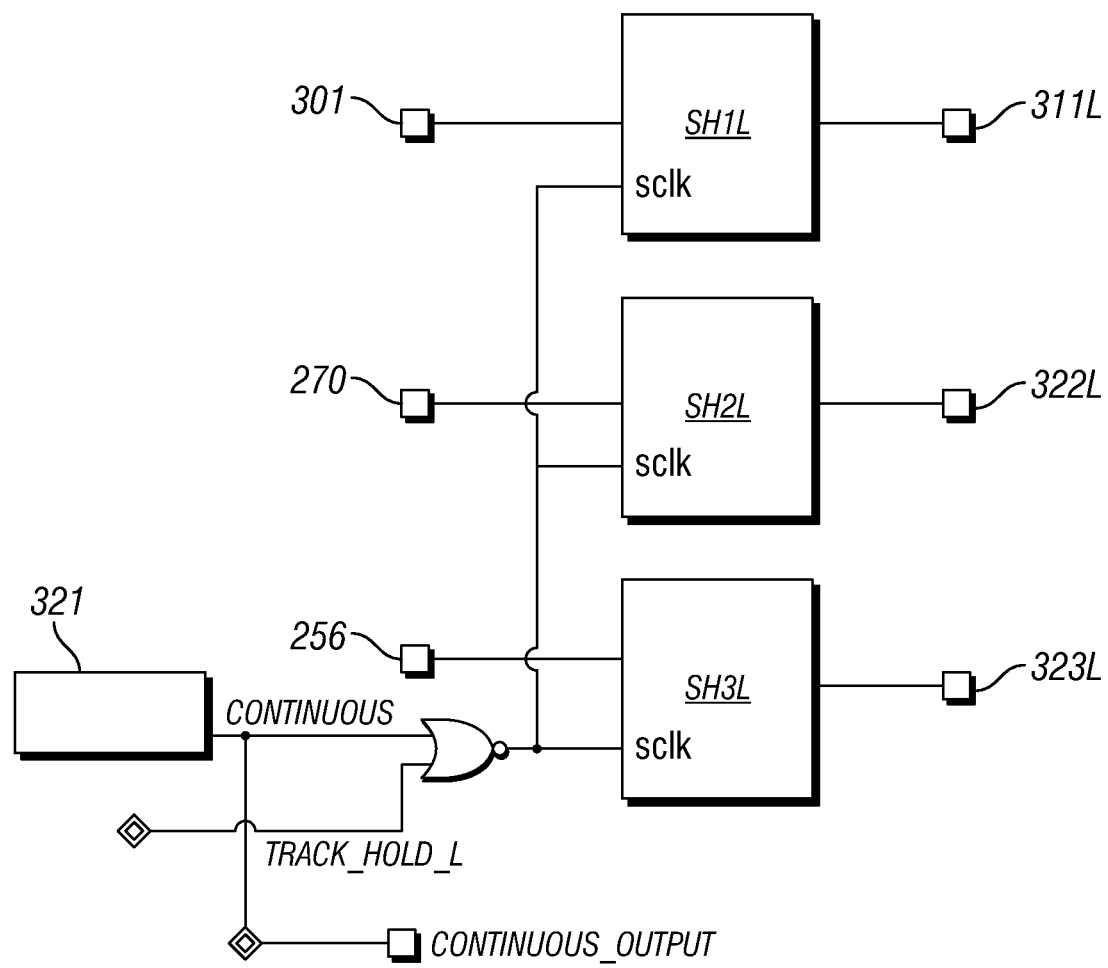
FIG. 10 illustrates exemplary sample and hold circuits, according to one or more embodiments described.

FIG. 10 illustrates the second set of sample and hold circuits SH1L, SH2L, and SH3L, according to one or more embodiments described. The second set of sample and hold circuits SH1L, SH2L, and SH3L may be similar to the sample and hold circuits SH1, SH2, and SH3 illustrated in FIG. 3 above, except that the second set of sample and hold circuits SH1L, SH2L, and SH3L may act on the lower level of the 2-level RF process signal, and the sample and hold circuits SH1, SH2, and SH3 may act on the higher level of the 2-level RF process signal. As such, while the sample and hold circuits SH1, SH2, and SH3 may provide the tracked RF power output signal 311, the tracked magnitude signal 322 and the tracked phase signal 323 corresponding to the higher level of the 2-level RF process signal, the second set of sample and hold circuits SH1L, SH2L, and SH3L may provide a tracked RF power output signal 311L, a tracked magnitude signal 322L, and a tracked phase signal 323L corresponding to the lower level of the 2-level RF process signal. The tracked RF power output signal 311L, the tracked magnitude signal 322L, and the tracked phase signal 323L may be input to the match controller 148 (FIG. 1).

Figure 11:
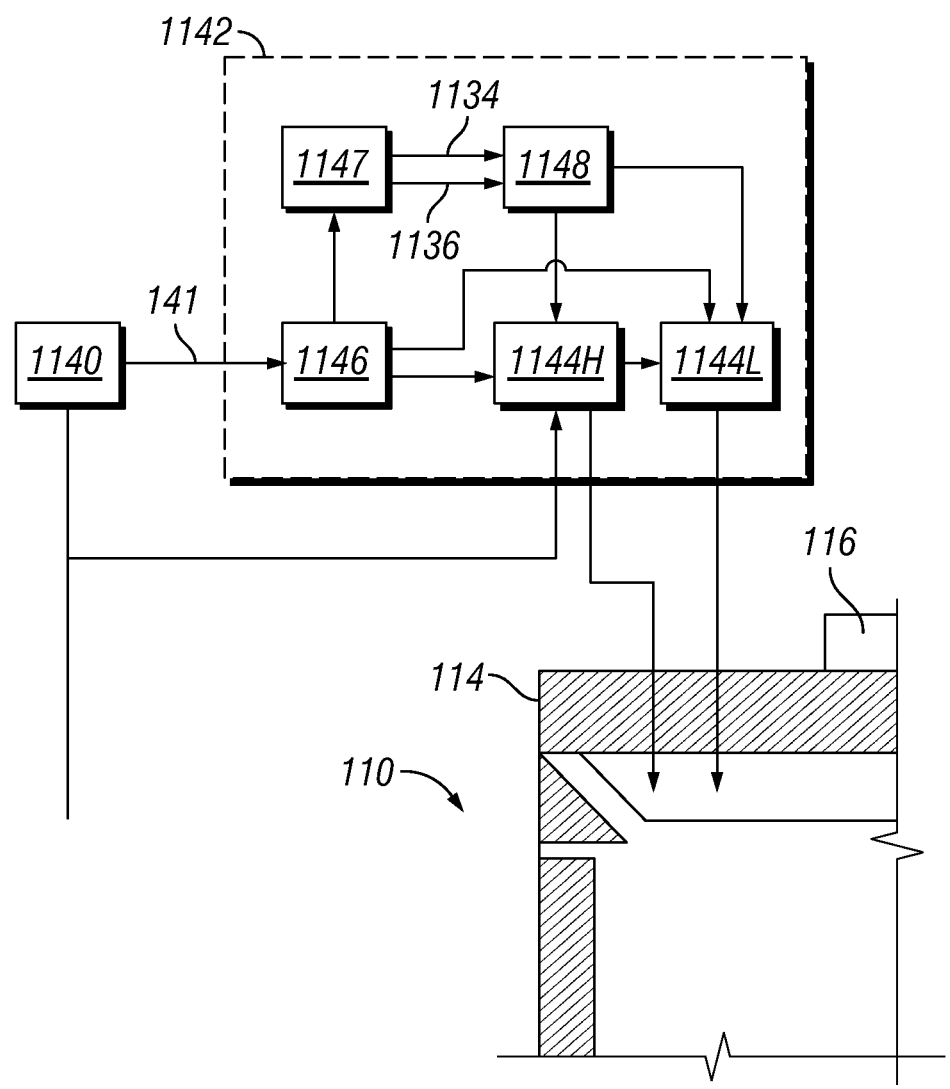
FIG. 11 illustrates a modified RF match system, according to one or more embodiments described.

When the process signal is a 2-level signal, one or more of the RF match systems 142, 162, 172 may be modified to process the 2-level process signal. FIG. 11 illustrates a modified RF match system 1142, according to one or more embodiments described. It can be understood that similar modifications may be carried out to the RF match systems 162, 172.

As illustrated, in the RF match system 1142, a pulse tracking circuit 1147 may communicate the tracked magnitude signal 322 and the tracked phase signal 323 corresponding to a high level of the 2-level process signal on an output line 1134 to a match controller 1148. The pulse tracking circuit 1147 may communicate the tracked magnitude signal 322L and the tracked phase signal 323L corresponding to a low level of the 2-level process signal on an output line 1136 to the match controller 1148. The match controller 1148 may output a signal to each of two RF matching networks 1144H and 1144L, both of which are connected to the chamber 110. Each of the two RF matching networks 1144H and 1144L may include a variable or adjustable impedance. The match controller 1148 may adjust or vary the impedance of the two RF matching networks 1144H and 1144L based on the input on output lines 1134, 1136 and on the magnitude error signal and the phase error signal from a phase and magnitude detector circuit 1146. The match controller 1148 may be configured to switch between varying the impedance of RF matching network 1144H and varying the impedance of RF matching network 1144L based on a value of the signal RF_ON_BAR. It should be noted that the phase and magnitude detector circuit 1146, the pulse tracking circuit 1147, the match controller 1148, and/or the RF matching networks 1144H and 1144L may be similar to the respective components of the first RF match system 142 (FIG. 1), except that the phase and magnitude detector circuit 1146, the pulse tracking circuit 1147, and/or the match controller 1148 may be configured to output and/or receive two signals.

Although FIG. 11 illustrates two RF matching networks 1144H and 1144L, a single RF matching network may be used instead of the two RF matching networks 1144H and 1144L to provide the combined functionality of the two RF matching networks 1144H and 1144L. For optimum performance, such a combined RF matching network may be required to have to switching speed of less than about 1 microsecond (µs) when switching between varying the two impedances.

According to an example embodiment, a communication channel may be provided between the match controller 148 and the pulse tracking circuit 147. For example, the communication channel may be used to communicate timer values to the DONE timer 404 and/or the OFF timer 405. As such, the values of these timers may be configurable. The communication channel from the match controller 148 may also be used to communicate the value of the DAC 331, and the LEVEL signal (see above) may not be required.

The pulse tracking circuit 147 may allow the RF matching network 144 to be tuned to increase power transfer efficiency from the first RF generator 140 to the chamber 110. The pulse tracking circuit 147 may not receive any information from the first RF generator 140, and may measure the pulse width of the process signal 141 and set the sample and hold times on the next pulse of the RF signal based on a current pulse. This is advantageous since this frees the plasma chamber designer to choose any RF generator and pair it with a desired matching controller. This disconnects the requirement that the RF generator and the match controller be made by a same manufacturer. Conventional matching networks require a synchronization signal from the RF generator to the match controller to indicate the timing information of the RF pulses. The pulse tracking circuit 147 eliminates this requirement.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

I claim:

1. A method of tuning a first radio frequency (RF) matching network during a pulsed mode operation, comprising:
    sensing a pulsing process signal transmitted from an RF generator to a target in a plasma processing chamber via the first RF matching network with a phase and magnitude detector circuit;
    tracking a magnitude error signal and a phase error signal output by the phase and magnitude detector circuit using at least two sample and hold circuits, the magnitude error signal and the phase error signal being respectively input to the at least two sample and hold circuits, and the at least two sample and hold circuits configured to track the magnitude error signal and the phase error signal based on a width of a pulse of the pulsing process signal;
    generating a first tracked magnitude signal and a first tracked phase signal corresponding to the magnitude error signal and the phase error signal with a pulse tracking circuit electrically coupled to the phase and magnitude detector circuit; and
    tuning the first RF matching network with a match controller electrically coupled to the first RF matching network and the pulse tracking circuit in response to the first tracked magnitude signal and the first tracked phase signal, the first RF matching network being tuned while the RF generator transmits the pulsing process signal to the target in the plasma processing chamber via the first RF matching network.

2. The method of claim 1, further comprising:
    calculating the width of the pulse of the pulsing process signal using a first timer circuit;
    calculating an amount of time from a rising edge of the pulse based on the calculated width of the pulse; and
    tracking the magnitude error signal and the phase error signal after the amount of time has elapsed.

3. The method of claim 2, further comprising:
    setting a first value obtained by subtracting a pre-determined value from the width of the pulse in a second timer circuit;
    setting a second value in a third timer circuit, the second value being one of a pre-determined value, a value equal to at least one clock cycle, and a portion of the width of the pulse;
    performing a countdown operation in each of the second and third timer circuits;
    setting each of the at least two sample and hold circuits in a sample position when the third timer circuit completes the countdown operation; and
    setting each of the at least two sample and hold circuits in a hold position when the second timer circuit completes the countdown operation.

4. The method of claim 3, wherein the third timer circuit completes the countdown operation before the second timer circuit.

5. The method of claim 3, wherein the first tracked magnitude signal and the first tracked phase signal are generated when the at least two sample and hold circuits are set in the hold position.

6. The method of claim 2, further comprising:
    indicating a completion of a plasma process when a time period between two adjacent pulses of the pulsing process signal is greater than a pre-determined amount of time; and
    indicating to the match controller to turn off tuning the first RF matching network based on the completion indication.

7. The method of claim 2, further comprising:
    indicating to the match controller to ignore the first tracked magnitude signal and the first tracked phase signal when a time period between two adjacent pulses of the pulsing process signal is greater than a pre-determined amount of time.

8. The method of claim 1, wherein tuning the first RF matching network further comprises adjusting a variable impedance of the first RF matching network.

9. The method of claim 8, wherein adjusting the variable impedance of the first RF matching network further comprises adjusting at least one variable element of the first RF matching network with at least one adjusting device.

10. The method of claim 1, wherein the pulsing process signal is a 2-level signal, and the method further comprises:
generating a second tracked magnitude signal and a second tracked phase signal corresponding to a low level of the 2-level pulsing process signal with the pulse tracking circuit; and
tuning a second RF matching network with the match controller in response to the second tracked magnitude signal and the second tracked phase signal, the second RF matching network being tuned while the RF generator transmits the 2-level pulsing process signal to the target in the plasma processing chamber via the second RF matching network.

11. The method of claim 10, further comprising:
switching the match controller between tuning the first RF matching network and tuning the second RF matching network based on an input from the pulse tracking circuit.

12. A system for tuning a first radio frequency (RF) matching network during pulsed mode operation, comprising:
an RF generator configured to supply a pulsing process signal to a target in a plasma processing chamber via the first RF matching network;
a phase and magnitude detector circuit coupled to the RF generator and configured to sense the pulsing process signal and to output a magnitude error signal and a phase error signal;
a pulse tracking circuit electrically coupled to the phase and magnitude detector circuit, the pulse tracking circuit comprising a first group of at least two sample and hold circuits configured to receive the magnitude error signal, the phase error signal and a tinning signal, and output a first tracked magnitude signal and a first tracked phase signal based on the timing signal; and
a match controller electrically coupled to the pulse tracking circuit and the first RF matching network and configured to receive the first tracked magnitude signal and the first tracked phase signal and to vary an impedance of the first RF matching network in response to the first tracked magnitude signal and the first tracked phase signal.

13. The system of claim 12, wherein the pulse tracking circuit further comprises:
a comparator circuit configured to generate a comparison signal based on a forward power input signal, the forward power input signal being generated by the phase and magnitude detector circuit.

14. The system of claim 13, wherein the pulse tracking circuit further comprises:
a first timer circuit configured to calculate a width of a pulse of the pulsing process signal;
a second timer circuit configured to set the at least two sample and hold circuits of the first group in a sample position; and
a third timer circuit configured to set the at least two sample and hold circuits of the first group in a hold position.

15. The system of claim 14, wherein the pulse tracking circuit further comprises:
a fourth timer circuit configured to indicate a completion of a plasma process when a time period between two adjacent pulses of the pulsing process signal is greater than a first value; and
a fifth timer circuit configured to indicate to the match controller to ignore the first tracked magnitude signal and the first tracked phase signal when a time period between two adjacent pulses of the pulsing process signal is greater than a second value.

16. The system of claim 15, further comprising:
at least one synchronization circuit configured to synchronize the comparison signal with a system clock, to provide the synchronized comparison signal to the first timer circuit, the second timer circuit and the third timer circuit, and to provide an inverted synchronized comparison signal to the fourth timer circuit and the fifth timer circuit.

17. The system of claim 14, wherein the second and third timer circuits are further configured to generate the timing signal in response to the comparison signal.

18. The system of claim 14, further comprising:
at least one synchronization circuit configured to synchronize the comparison signal with a system clock, and to provide the synchronized comparison signal to the first timer circuit, the second timer circuit, and the third timer circuit.

19. The system of claim 13, wherein:
the pulsing process signal is a 2-level signal;
the comparison signal is inverted to generate an inverted comparison signal;
the inverted comparison signal is input to a first timer circuit and a second timer circuit of the pulse tracking circuit to generate a timing signal corresponding to a low level of the 2-level pulsing process signal;
the timing signal is input to a second group of at least two sample and hold circuits, the sample and hold circuits of the second group generating a second tracked magnitude signal and a second tracked phase signal, the second tracked magnitude signal and the second tracked phase signal corresponding to the low level of the 2-level pulsing process signal; and
the match controller is further configured to receive the second tracked magnitude signal and the second tracked phase signal and to vary an impedance of a second RF matching network in response to the second tracked magnitude signal and the second tracked phase signal.

20. The system of claim 19, wherein the match controller is configured to switch between varying an impedance of the first RF matching network and varying an impedance of the second RF matching network based on the inverted comparison signal.

21. A method of tuning a first radio frequency (RF) matching network of a plasma chamber during pulse mode operation, the method comprising:
transmitting a pulsing process signal from an RF generator to the plasma chamber via the first RF matching network;
sensing the pulsing process signal with a phase and magnitude detector circuit coupled to the RF generator;
outputting a magnitude error signal and a phase error signal with the phase and magnitude detector circuit;
performing a first sample and hold operation in response to a timing signal on the magnitude error signal to output a first tracked magnitude signal using a pulse tracking circuit electrically coupled to the phase and magnitude detector circuit;
performing a second sample and hold operation in response to the timing signal on the phase error signal to output a first tracked phase signal using the pulse tracking circuit; and
varying an impedance of the first RF matching network with a match controller in response to the first tracked magnitude signal and the first tracked phase signal to reduce reflected power from the plasma chamber, the match controller being electrically coupled to the pulse tracking circuit and the first RF matching network.

22. The method of claim 21, further comprising:
performing a first countdown operation in a first timer circuit using a first value derived from a width of a pulse of the pulsing process signal, the first countdown operation resulting in a first triggering signal;
performing a second countdown operation in a second timer circuit using a second value derived from the width of the pulse of the pulsing process signal, the second countdown operation resulting in a second triggering signal; and
generating the timing signal based on the first and second triggering signals.

23. The method of claim 22, further comprising:
indicating a completion of a plasma process when a time period between two adjacent pulses of the pulsing process signal is greater than a first value; and
indicating to the match controller to ignore the first tracked magnitude signal and the first tracked phase signal when a time period between two adjacent pulses of the pulsing process signal is greater than a second value.

24. The method of claim 21, wherein the pulsing process signal is a 2-level signal, and the method further comprises:
generating a second tracked magnitude signal and a second tracked phase signal corresponding to a low level of the 2-level pulsing process signal with the pulse tracking circuit; and
varying an impedance of a second RF matching network of the plasma chamber with the match controller in response to the second tracked magnitude signal and the second tracked phase signal.

25. The method of claim 24, further comprising:
switching the match controller between varying the impedance of the first RF matching network and varying the impedance of the second RF matching network based on an input from the pulse tracking circuit.

* * * * *